US012694195B2

(12) United States Patent
Chiranjeevi et al.

(10) Patent No.: US 12,694,195 B2
(45) Date of Patent: Jul. 28, 2026

(54) ENHANCED ARTIFICIAL INTELLIGENCE FOR PERFORMANCE VALIDATION OF CORE INTEGRAETED CIRCUIT FEATURES

(71) Applicant: Intel Corporation, Santa Clara, CA (US)

(72) Inventors: Kunapareddy Chiranjeevi, Hyderabad (IN); Sakina Pitalwala, Bangalore (IN); Karthik Varadarajan Rajagopal, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 17/969,891

(22) Filed: Oct. 20, 2022

(65) Prior Publication Data

US 2024/0135082 A1    Apr. 25, 2024
US 2024/0232502 A9    Jul. 11, 2024

(51) Int. Cl.
     *G06F 30/398*      (2020.01)
     *G06F 30/27*      (2020.01)

(52) U.S. Cl.
     CPC ............ *G06F 30/398* (2020.01); *G06F 30/27* (2020.01)

(58) Field of Classification Search
     USPC ........................................................ 716/112
     See application file for complete search history.

(56) References Cited

U.S. PATENT DOCUMENTS 6,691,080 B1 *   2/2004   Tachibana ........... G06F 11/3457
                                         703/19
2021/0390236 A1 *   12/2021   Jin .......................... G06F 30/33

OTHER PUBLICATIONS

Yasin, "A Top-Down method for performance analysis and counters architecture," 2014 IEEE International Symposium on Performance Analysis of Systems and Software (ISPASS), Monterey, CA, USA, (2014), 19 pages.
Shah et al., "An Empirical Evaluation of Density Based Clustering Techniques", International Journal of Soft Computing and Engineering, (2012) , vol. 2, Issue 1, Mar. 2012, 8 pages.

(Continued)

*Primary Examiner* — Bryce M Aisaka
(74) *Attorney, Agent, or Firm* — Gray Ice Higdon, PLLC

(57) ABSTRACT

This disclosure describes systems, methods, and devices related to using artificial intelligence to validate performance of integrated circuit features. A device may extract, from instruction files, microinstructions source and destination registers; generate a dependency graph including macroinstructions as nodes and dependencies between macroinstructions as edges between the nodes; generate, based on the dependency graph, a frequency distribution of instructions from trace files, performance univariate autoregressive conditionally heteroscedastic (Perf uarch) stat files, and register transfer language (RTL) stat files, predictors for a machine learning model; generate, based on the Perf uarch stat files and the RTL stat files, ratios of Perf uarch stats to RTL stats as target stat ratios; generate, using the predictors and the machine learning model, predicted ratios of Perf uarch stats to RTL stats; and generate, using greedy constrained optimization, based on the target stat ratios and the predicted ratios, recommended traces for debugging.

20 Claims, 6 Drawing Sheets

(56) References Cited

OTHER PUBLICATIONS

Gal et al., "Using AI for Performance Verification of High-End Processors" ICPE '19: Companion of the 2019 ACM/SPEC International Conference on Performance Engineering, (2019), 2 pages.

Hu et al., "Study on Improving Z-score Model Based on the Logistic Model: Evidence from Listed Companies in China," International Conference on Information Management, Innovation Management and Industrial Engineering, (2009) 2, 5 pages.

Levinthal, "Performance Analysis Guide for Intel® Core™ i7 Processor and Intel® Xeon™ 5500 processors" 2008-2009 Intel Corporation, 72 pages.

Breiman, "Random Forests". Machine Learning (2001) 45, 28 pages.

Franceschet, "PageRank: Standing on the shoulders of giants" Communications of the ACM (2010), arXiv:1002.2858v3, 9 pages.

* cited by examiner

200

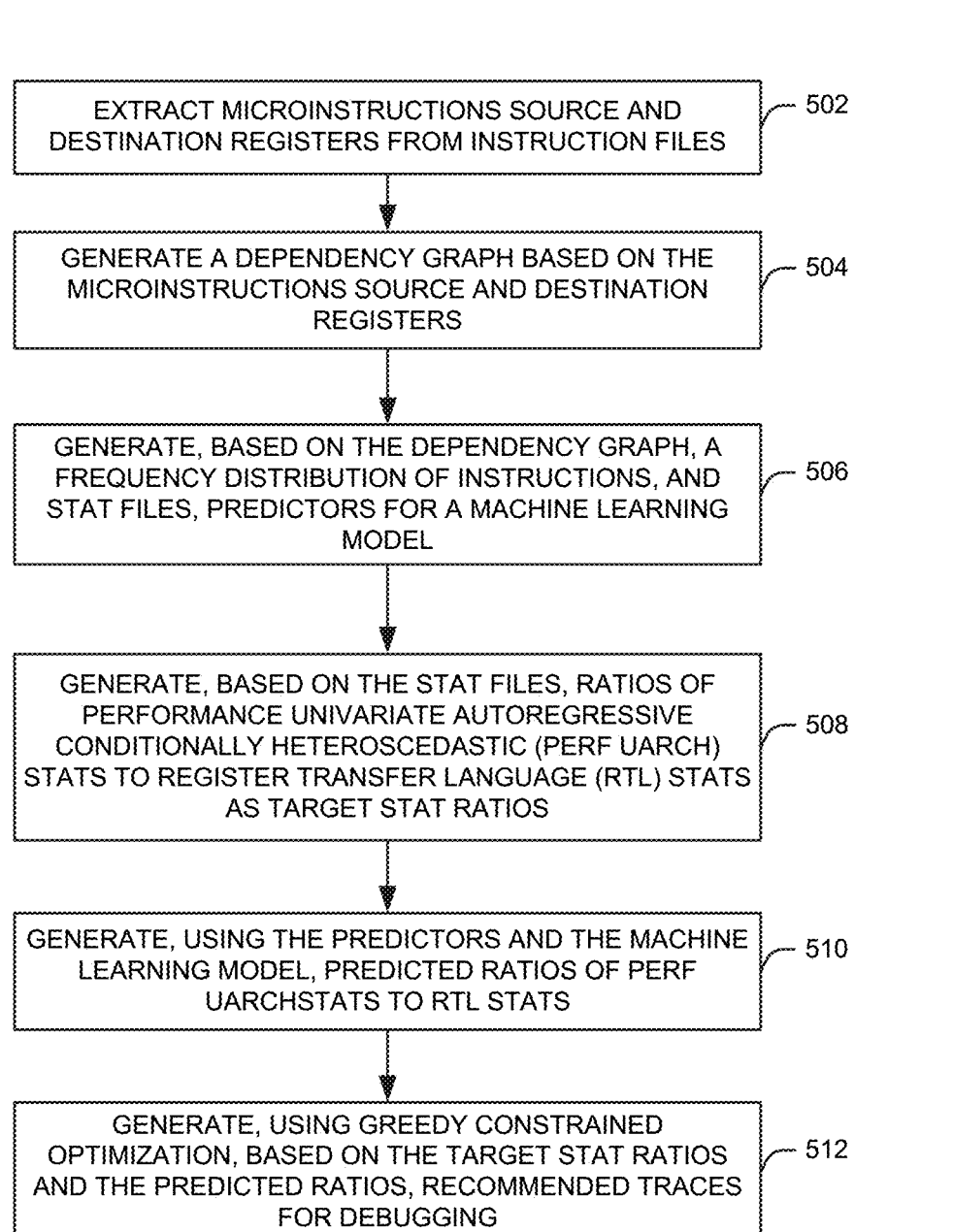

~ 500

EXTRACT MICROINSTRUCTIONS SOURCE AND DESTINATION REGISTERS FROM INSTRUCTION FILES — 502

GENERATE A DEPENDENCY GRAPH BASED ON THE MICROINSTRUCTIONS SOURCE AND DESTINATION REGISTERS — 504

GENERATE, BASED ON THE DEPENDENCY GRAPH, A FREQUENCY DISTRIBUTION OF INSTRUCTIONS, AND STAT FILES, PREDICTORS FOR A MACHINE LEARNING MODEL — 506

GENERATE, BASED ON THE STAT FILES, RATIOS OF PERFORMANCE UNIVARIATE AUTOREGRESSIVE CONDITIONALLY HETEROSCEDASTIC (PERF UARCH) STATS TO REGISTER TRANSFER LANGUAGE (RTL) STATS AS TARGET STAT RATIOS — 508

GENERATE, USING THE PREDICTORS AND THE MACHINE LEARNING MODEL, PREDICTED RATIOS OF PERF UARCHSTATS TO RTL STATS — 510

GENERATE, USING GREEDY CONSTRAINED OPTIMIZATION, BASED ON THE TARGET STAT RATIOS AND THE PREDICTED RATIOS, RECOMMENDED TRACES FOR DEBUGGING — 512

FIG. 5

ENHANCED ARTIFICIAL INTELLIGENCE FOR PERFORMANCE VALIDATION OF CORE INTEGRAETED CIRCUIT FEATURES

TECHNICAL FIELD

This disclosure generally relates to devices, systems, and methods for validation of integrated circuits and, more particularly, to using artificial intelligence to validate performance of integrated circuit features.

BACKGROUND

Ever increasing demand for high-performance processors and shorter time to market establish a need for faster performance validation strategies of integrated circuits. Some current processes of performance validation of core integrated circuit features involve manually analyzing large number of traces with the help of performance metrics. The manual validation process is inefficient and time-consuming.

BRIEF DESCRIPTION OF THE DRAWINGS

FIG. 5 illustrates a flow diagram of an illustrative process for using artificial intelligence to validate performance of integrated circuit features, in accordance with one or more example embodiments of the present disclosure.

DETAILED DESCRIPTION

Figure 1:
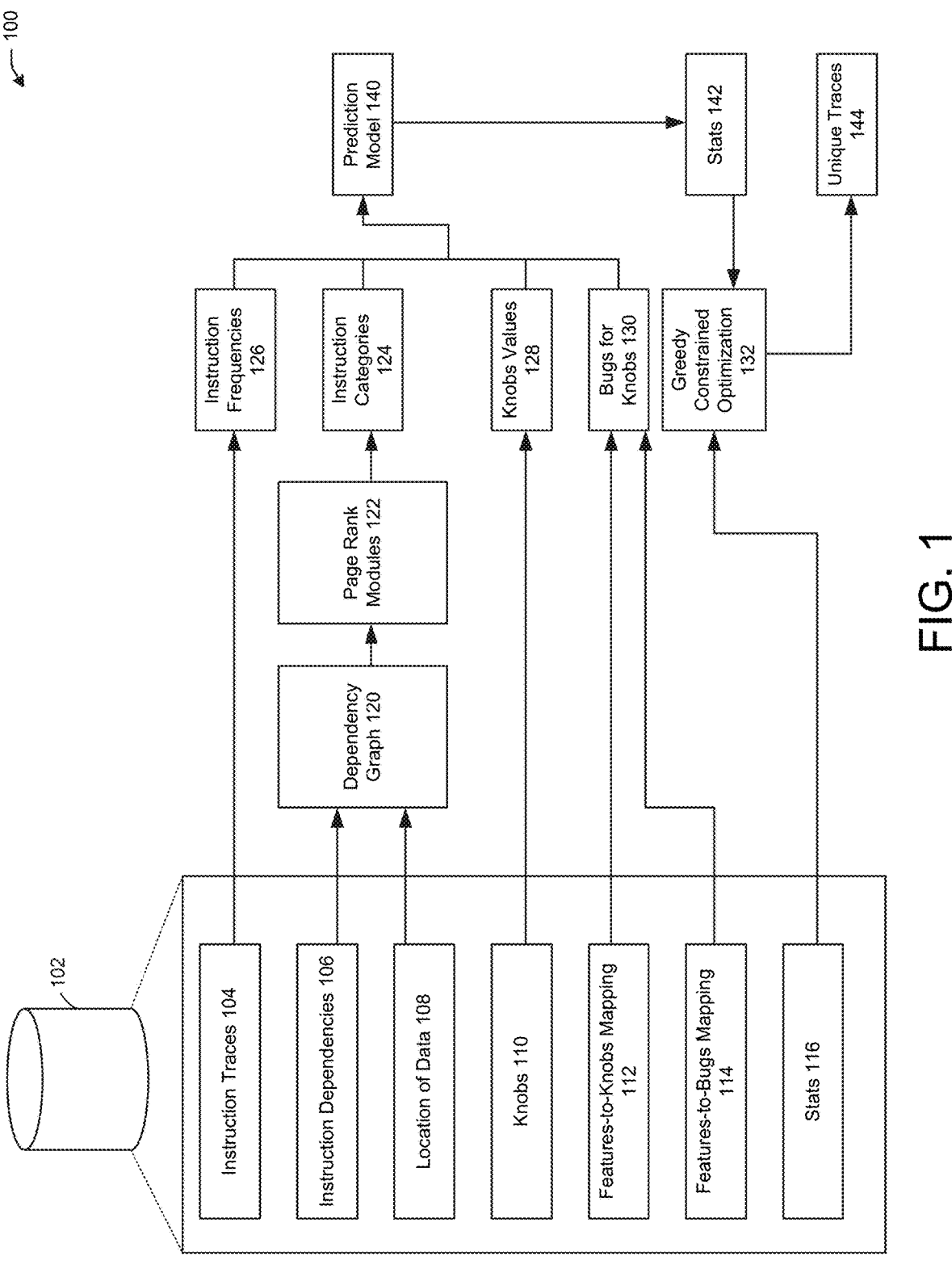
FIG. 1 is an example process for using artificial intelligence to validate performance of integrated circuit features, according to some example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

Integrated circuit manufacturing may use validation of core features, such as circuit traces. However, manual processes for validating integrated circuits like integrated circuits often are time-consuming, may result in analyzing duplicate traces indicative of a same bug, and may undermine product quality due to performance issues being masked by incorrect bucketing.

In an existing process of performance validation (e.g., in contrast with functional validation) of core integrated circuit features, a set of traces are run on a register-transfer level (RTL) model and a performance univariate autoregressive conditionally heteroscedastic (Perf uarch) simulator model, which is a reference model based on C. Whereas functional validation verifies whether a component is doing what it is supposed to do, performance validation verifies that a component is using the correct computation to do what it is supposed to do.

The performance of the RTL model may be compared with the Perf uarch simulator model based on the total cycles. While traces are run on the two models, statistical values are updated for each model. The traces having a higher deviation between RTL and Perf uarch simulator cycles than a predefined threshold are labeled as outliers. The outliers and statistics are further analyzed to identify buggy features.

Debugging failures using an existing performance validation methodology may pose the following challenges: (1) Existing validation techniques may be time-consuming due to manual process of analyzing stats, and also may lead to duplication of effort as different stats outliers could be due to the same performance bottleneck; (2) few traces which are not outliers could have real performance issues hiding; (3) because the number of stats and traces is significant, with a visualization approach, it may not be intuitive to analyze the matrix and identify the traces that are impacted by buggy features; and (4) because stats are updated based on traces that are run on the integrated circuit features, they are highly dependent on the instructions and the features that they impact. Thus, comparing traces directly based on stats values may not provide accurate results.

To address above-mentioned problems, the present disclosure provides an artificial intelligence (AI)-based approach.

In one or more embodiments the enhanced AI-based validation approach herein considers all the traces (e.g., both outliers and non-outliers) and recommends a reduced set of traces which are impacted by the integrated circuit features with unique bugs. The enhanced approach herein may employ three algorithms, such as Page Rank, Random Forest, and Greedy constrained optimization, to recommend unique traces to debug performance issues. The AI-based approach distinguishes from existing validation approaches based on data visualizations and the manual approach.

Benefits of the enhanced approach herein include improving product quality by identifying bugs that are skipped in a manual approach and by reducing resources and time needed for validation.

In one or more embodiments, the enhanced validation techniques herein may facilitate finding traces that would help in identifying unique bugs, covering the underlying reasons for deviation between models and how they solve the problem. For example, divergent traces are defined as the ones that would point to an actual bug. There are several factors that impact the stat values which result in the convergence or divergence of the traces in the two models. These factors are as following: Feature implementation, features and instructions, randomness due to speculative/eager execution, bugs in RTL code, and feature maturity and complexity.

Regarding feature implementation, based on the varying expertise of the people implementing the features, choice of algorithms and the programming language, the optimization with which the features are implemented in the two models may vary. Depending upon how the features are implemented, the micro-instructions executed can differ. This may cause a separate set of events to occur while running the two models. Hence, stat values for each model will be updated differently.

Regarding features and instructions, the resources consumed at execution time due to the interaction between the IP features and instructions will cause the stat values to update accordingly.

Regarding randomness due to speculative/eager execution, due to the probabilistic nature of the Speculative execution and based on prefetcher code accuracy, the data and instructions that are pre-fetched may vary. Due to this, the type of resources consumed at the execution time may cause the associated stats values to change.

Regarding bugs in RTL code, functional and performance bugs present in the implemented features may impact the performance of the models causing the stat values to deviate. Also, these may result into core feature gains less than what was projected by the C model.

Regarding feature maturity and complexity, once a feature achieves a certain RTL and validation milestone, there could be few scenarios that may remain untested. Due to this, there could be few unresolved bugs present in the code. Since these bugs are not known, the feature maturity and complexity may provide some indication of the presence of such bugs. These bugs, though unknown may impact the stats. Thus, the complexity and maturity of the features may have an indirect impact on the updated stats.

In one or more embodiments, Equation (1) below may be used for a formulation of validation statistics:

$$\text{Total Stat}=S_c+S_{kb}+S_{ub} \tag{1},$$

where $S_c$ are stats updated due to the computation/execution of instructions on features; $S_{kb}$ are stats updated due to the known bugs in the RTL code, and $S_{ub}$ are stats updated due to unknown bugs. The formulation according to Equation (1) forms the basis of the enhanced design here, where a machine learning (ML) model is trained on predictors representing above factors to predict stat values. A high-level design of the artificial intelligence (AI)-based approach may include aspects such as data, transformations, predictors, model development, and trace recommendation logic.

In one or more embodiments, feature engineering may be performed to transform the raw data elements into machine learning features/predictors. Instruction frequencies: The amount by which stats are updated while running the traces will vary based on the type of the instruction or the opcode and the number of times it appears in the trace. Since, each trace will have multiple instructions that takes the same operators, a count of each operator in the trace is used as a predictor. Instruction dependencies: Instructions are dependent on other preceding instructions for data to complete its execution. In addition, these dependencies will differ from run to run based on how these instructions interact with the core features during runtime. A directed graph may be constructed with macroinstructions as nodes and dependencies between them as the edges based on the source and destination register information of micro-operations. To categorize these instructions based on their importance in the graph, each instruction in the graph may be scored using Page Rank algorithm. A frequency distribution of these scores per trace may be used as the input predictors for the ML model. Knobs: The interaction between IP features and the instructions is one of the factors which affects stat values. The knobs which are used to enable or disable a feature in the RTL or Perf uarch simulator models act as a proxy to the actual features. Thus, each knob value in the knobs file is used as a predictor for the model. Outlier/non-outlier trace: As mentioned in Equation (1), actual stat value $S_a$ may be a sum of $S_c$, $S_{kb}$, and $S_{ub}$. Without the real debug analysis for the historical data regarding actual failed traces, the enhanced techniques herein may use the concept of outlier/non-outlier traces. This information is added as a predictor for the ML model. Stats: In the ML model, stats ratios (e.g., ratios of Perf uarch simulator stats versus RTL stats) are used as the output variables. A model is built for each of the 200 stats (or some other number of stats).

In one or more embodiments, to predict the values of the stats variables, machine learning models may be built for each stat using all the predictors, which may include instruction frequencies, instruction categories, and knobs. The models may be trained on 56 regression runs (or some other number). The total number of records in the training data may be about 37000, and the number of predictors may be about 400. Out of all the experimented models, Random Forest models performed the best when tested. K-fold cross validation may be used to evaluate the two algorithms used to train the machine learning models.

In one or more embodiments, to roll up the traces which would result in the identification of unique bugs, a greedy constrained optimization technique may be used. For predicted values of stats, the following scenarios are possible in case of convergent and divergent traces. In case of convergent traces, if the predicted stat value is equal to the actual stat value, then the stat may be labeled as a non-issue stat, since the value is predicted based on convergent traces (e.g., no unknown bugs). If the predicted value is greater than or equal to the actual value, no conclusion may be drawn regarding whether the stats are issue stats or not, as the bug could impact the stats both in positive and negative manner. Similarly, for divergent traces, in case of actual stats and predicted stats being equal, greater, or less, the difference could be small or large. To be able to label the problematic stats, a threshold may be needed. A greedy constrained optimization technique is used to generate the threshold, where a total number of final traces is fixed.

In one or more embodiments, the algorithm for trace recommendations may include passing test traces to all ML models as inputs to predict stats. For each trace, stat intervals may be predicted. By sampling from each prediction interval, hundreds of matrices may be formed for the traces. Using a greedy constrained optimization on each matrix may result in an optimal number of traces. The most frequent subset of traces from the optimal numbers of traces may be recommended for debugging.

To validate the accuracy of the enhanced techniques herein, the trace recommendations were tested on 18 regression runs and validated using the following key performance indicators. For each of 18 regressions, the AI-recommended traces were debugged to find the number of traces that helped in identifying unique bugs in the features out of the total number of traces that were assigned to be debugged. This percentage also called the hit rate was observed to be 93%. The enhanced solution was tested further on four regression runs. 21 out of 24 traces resulted in identification of unique bugs giving a hit rate of 87%. In addition, among these, nine bugs that were identified by AI method were not identified by the manual approach.

In this manner, the enhanced solution herein presents how an AI-based approach improve one of the most important phases of a integrated circuit performance debugging process, which is identifying the right traces to be debugged. The results showed that the enhanced solution reduced significant duplicate effort that goes into the debugging performance issues by recommending traces that help in identification of bugs that are unique. The enhanced solution also provided the most problematic stats for each trace to the debuggers, which eased the debug process. Notably, the solution also identified bugs that were not identified by the manual process. The enhanced solution herein improves the performance validation process for integrated circuits and is not only confined to the core features, but could be reused or extended across various verticals and could have a significant impact on the overall efficiency and quality of the pre- and post-performance validation process.

In one or more embodiments, features herein may refer to core capabilities, Perf uarch simulator model may refer to a C/C++ implementation of the core capabilities, RTL model may refer to a RTL implementation of the core capabilities, instructions may refer to machine language operation with operator and operands, traces may refer to sequences of instructions, stats may refer to counters/metrics updated/incremented during execution of workloads, workloads may refer to sequences of traces used to validate the performance of core implementations, and knobs may refer to levers used to enable/disable features.

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 is an example process 100 for using artificial intelligence to validate performance of integrated circuit features, according to some example embodiments of the present disclosure.

Figure 2:
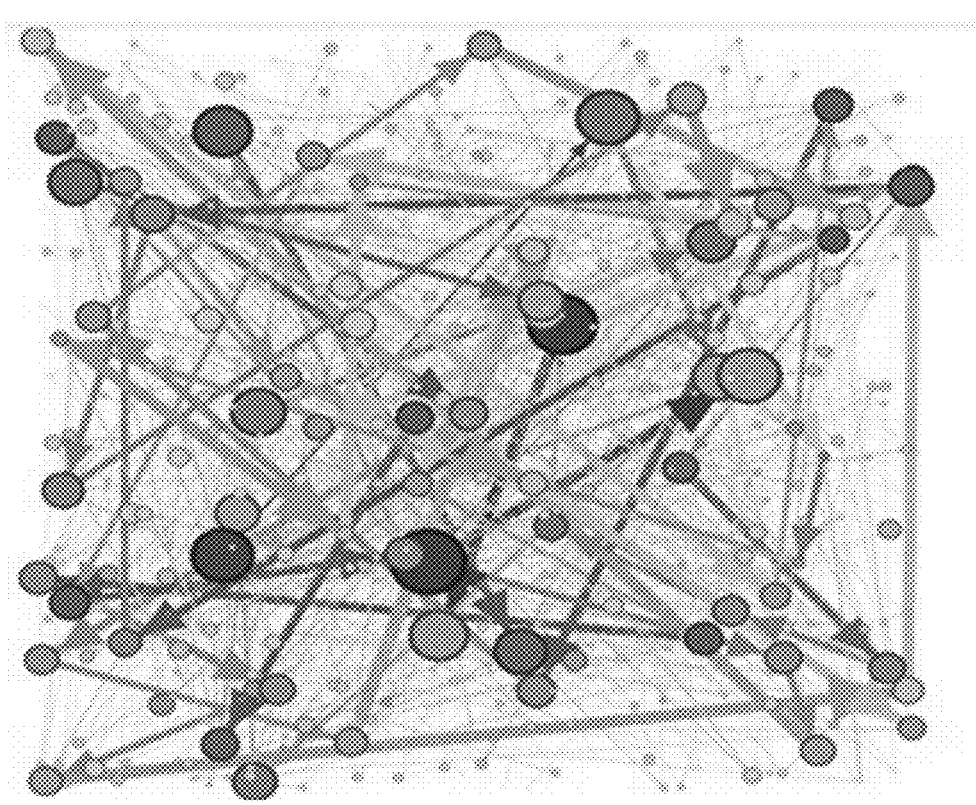
FIG. 2 illustrates an example instruction dependency graph for use in validating performance of integrated circuit features, according to some example embodiments of the present disclosure.

Referring to FIG. 1, the process 100 may include data from data storage 102, such as instruction traces 104 (e.g., trace files), instruction dependencies 106, location of data 108, knobs 110 (e.g., Perf uarch simulator stats files), features-to-knobs mapping 112, features-to-bugs mapping 114, stats 116 (e.g., Perf uarch simulator and RTL stats files) used to create features. The instruction dependencies 106 and the location of data 108 may be transformed into a dependency graph (e.g., as shown in FIG. 2), and processed by page rank modules 122 to generate instruction categories 124 as features. The instruction traces 104 may be used to generate instruction frequencies 126 as features. The knobs 110 may be used to generate knobs values 128 as features. The features-to-knobs mapping 112 and the features-to-bugs mapping 114 may be used to generate bugs for knobs 130 as features. The stats 116 may be input to a greedy constrained optimization 132. The features, including the instruction frequencies 126, the instruction categories 124, the knobs values 128, and the bugs per knobs 130 may be input to a prediction model 140, which may generate stats 142 as a prediction output. The stats 142 may be input to the greedy constrained optimization 132, which may use the stats 116 and the stats 142 to generate a ranking of unique traces 144.

In one or more embodiments, the process 100 may use feature engineering to transform the raw data elements into machine learning features/predictors. The amount by which stats are updated while running the traces will vary based on the type of the instruction or the opcode and the number of times it appears in the trace. Because each trace will have multiple instructions that takes the same operators, a count of each operator in the trace is used as a predictor. Regarding the instruction dependencies 106, instructions are dependent on other preceding instructions for data to complete its execution. In addition, these dependencies will differ from run to run based on how these instructions interact with the IP features during runtime. As shown in FIG. 2, the dependency graph 120 is constructed with macroinstructions as nodes and dependencies between them as the edges based on the source and destination register information of micro-ops. To categorize these instructions based on their importance in the graph, each instruction in the dependency graph 120 is scored using the page rank modules 122. A frequency distribution of these scores per trace (e.g., the instruction frequencies 126) is used as the input predictors for the prediction model 140.

In one or more embodiments, further regarding the feature engineering, the interaction between integrated circuit features and the instructions is one of the factors which affects stat values. The knobs 110 are used to enable or disable a feature in the RTL or Perf uarch simulator models act as a proxy to the actual features. Thus, each knob value in the knobs file is used as a predictor for the prediction model 140.

In one or more embodiments, the actual stats values are represented by Equation (1) above. Because the real debug analysis for the historical data regarding actual failed traces may not be available, the process 100 may use the concept of outlier/non-outlier traces described above. This information is added as a predictor for the prediction model 140. In the prediction model 140, stats ratios are used as the output variables (e.g., the stats 142). A model is built for each of the 200 stats.

In one or more embodiments, to roll up the traces that would result in the identification of unique bugs, the greedy constrained optimization 132 technique is used. For predicted values of stats, the following scenarios are possible in case of convergent and divergent traces. In case of convergent traces, if the predicted stat value (e.g., from the stats 142) is equal to the actual stat value (e.g., from the stats 116), the process 100 may label it as a non-issue stat, as the value is predicted based on convergent traces (e.g., no unknown bugs). If the predicted value (e.g., from the stats 142) is greater than or equal to the actual value (e.g., from the stats 116), the process 100 may not conclude whether the stats are issue stats or not, as the bug could impact the stats both in positive and negative manner. Similarly, for divergent traces, in case of actual stats and predicted stats being equal, greater, or less, the difference could be small or large. To be able to label the problematic stats, the process 100 may need to generate with a threshold. The greedy constrained optimization 132 technique is used to achieve this, where total number of final traces is fixed. The steps for the greedy constrained optimization 132 algorithm are shown in the FIG. 3.

In one or more embodiments, the instruction traces 104 may be parsed (e.g., using a file parser) to extract instruction opcodes used for the instruction frequencies 126. From the instruction dependencies 106, a parser may extract micro-instruction-to-macroinstruction mapping and micro instruction source and destination registers for use in generating the dependency graph 120. A parser may extract Perf uarch simulator knobs and values from Perf uarch simulator stats, and RTL stats and values from RL stats files (e.g., the Perf uarch simulator and RTL stats and values representing the stats 116). The ratio of the Perf uarch simulator to RTL stats (e.g., represented by the stats 116) are used as target stat ratios for the greedy optimization to use with predicted Perf uarch simulator to RTL stat ratios from the stats 142.

In one or more embodiments, the pre-processing of the data that results in the predictor values for the prediction model 140, such as the instruction frequencies 126, the instruction categories 124, the knobs values 128, and the bugs for knobs 130, may be used to generate the stats 142. The greedy constrained optimization 132 uses the stats 116 as the target. Based on the target and the predictors, the greedy constrained optimization 132 may generate the recommended traces (e.g., the unique traces 144).

FIG. 2 illustrates an example instruction dependency graph 200 for use in validating performance of integrated circuit features, according to some example embodiments of the present disclosure.

Referring to FIG. 2, the instruction dependency graph 200 may represent the dependency graph 120 of FIG. 1.

Instructions are dependent on other preceding instructions for data to complete its execution. In addition, these dependencies will differ from run to run based on how these instructions interact with the IP features during runtime. As shown in FIG. 2, the instruction dependency graph 200 is constructed with macroinstructions as nodes (e.g., the circles in FIG. 2) and dependencies between them as the edges (e.g., the lines between the circles in FIG. 2) based on the source and destination register information of micro-ops. A larger node size indicates a higher score of instructions degree, and a darker node shade indicates a higher page rank score.

In one or more embodiments, to categorize these instructions based on their importance in the instruction dependency graph 200, each instruction in the instruction dependency graph 200 is scored using the page rank modules 122 of FIG. 1. For example, page ranking is a technique used to determine which pages are most important in terms of the pages hyperlinking to them. Applied to the instructions, the page rank modules 122 may determine the most important instructions in terms of the instructions depending from them.

Figure 3:
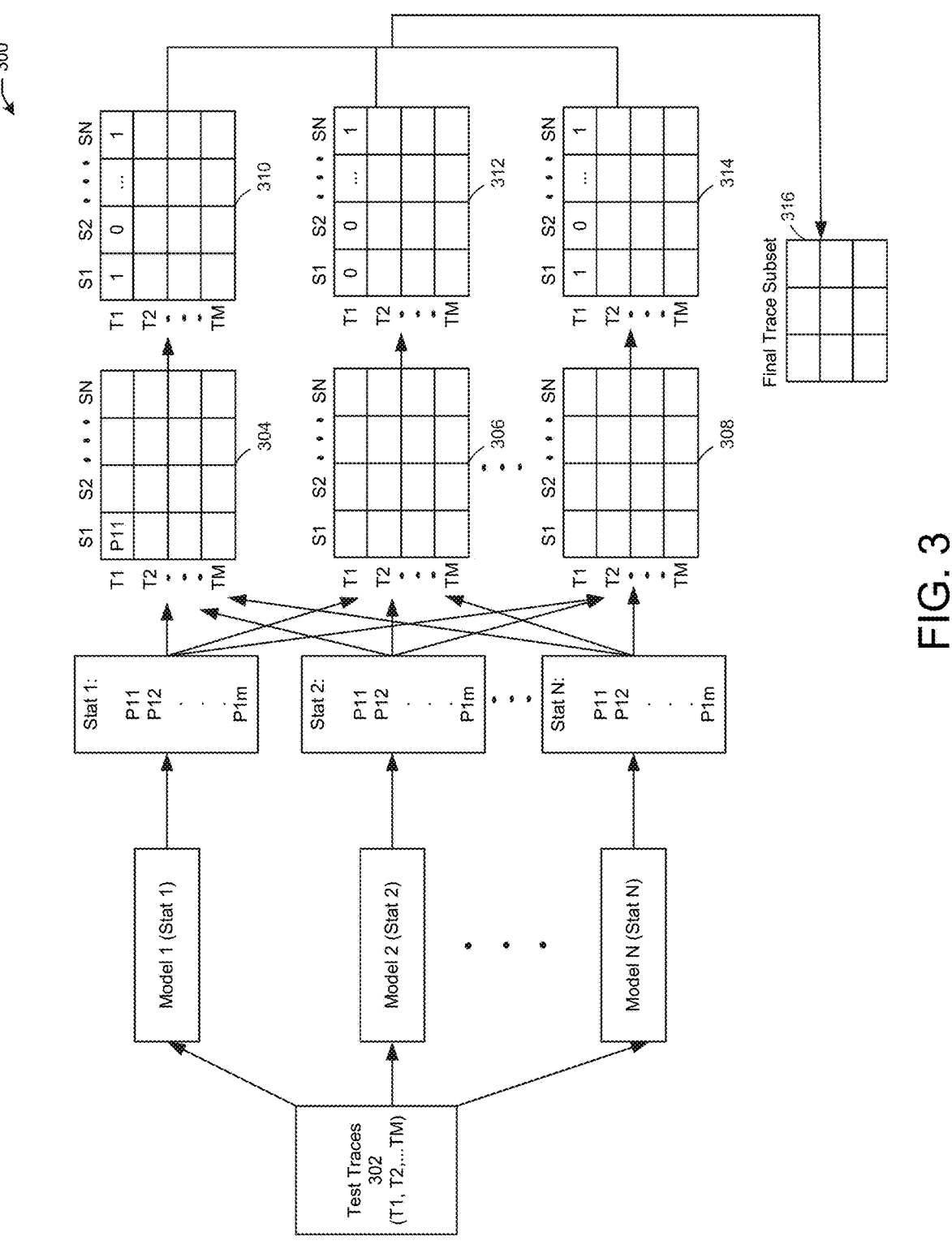
FIG. 3 is an example process for using artificial intelligence to validate performance of integrated circuit features, according to some example embodiments of the present disclosure.

FIG. 3 is an example process 300 for using artificial intelligence to validate performance of integrated circuit features, according to some example embodiments of the present disclosure.

Referring to FIG. 3, the process 300 may include test traces 302 (e.g., T1, T2, . . . , TM for M traces T) being input to each model (e.g., model 1 for stat 1, model 2 for stat 2, . . . , Model N for stat N). To predict the values of the stats variables, machine learning models are built for each stat (e.g., model 1 for stat 1, model 2 for stat 2, . . . , Model N for stat N) using all the predictors which include the instruction frequencies 126, the instruction categories 124, the and knob values 128, and the bugs for knobs 130 of FIG. 1. The models predict the stats for traces (e.g., the ratio of Perf uarch simulator to RTL stats). For example, model 1 may make predictions for stat 1, model 2 may make predictions for stat 2, and so on.

Still referring to FIG. 3, to avoid data discrepancies, the process 300 may use an optimization to include predicting stat intervals for each trace. For example, predictions P11, P12, . . . , Pm for m traces may be predicted ratios of Perf uarch simulator to RTL stats for the given trace T and given stat S. By sampling each prediction interval, matrices (e.g., hundreds of matrices such as matrix 304, 306, and 308) may be generated with T1-TM rows for the M traces and S1-SN columns for the N stats, with each matrix entry being an output for a trace T. Because of the different intervals, the predicted stat ratios for a give trace T and a given stat S may vary (e.g., as shown in matrix 304, 306, and 308). The greedy constrained optimization 132 of FIG. 1 may be performed on each matrix (e.g., matrix 304, 306, and 308) to produce an optimal number of traces. Because of the greedy optimization, the optimal number of traces may be the minimal number of traces that would indicate bugs in a stat (e.g., rather than having multiple traces indicate a same bug). For example, matrices 310, 312, and 314, having T1-TM rows for the M traces and S1-SN columns for the N stats, may indicate the optimal number of traces.

Still referring to FIG. 3, to generate matrix 310, for example, the predicted value P11 for trace T1 and stat S1 may be compared to the actual Perf uarch simulator to RTL ratio for trace T1 and stat S1, and the difference may be 1. In this manner, the matrices generated using the greedy constrained optimization may generate differences between expected (e.g., predicted) Perf uarch simulator to RTL ratios and actual Perf uarch simulator to RTL ratios (e.g., using the stats 116 as the actual data and the stats 142 of FIG. 1 as the predicted data). For example, a 1 value may indicate a divergence between the predicted and actual ratios (e.g., a divergence greater than a threshold divergence), and therefore an indication of a buggy statistic for the respective trace. The most frequent subset of traces indicating buggy statistics, based on the greedy optimization, may be included in the final trace subset 316 (e.g., the smallest set of traces that can be selected to indicate bugs—by having a 1 value—may be included in the final trace subset 316), which may be recommended for debugging. For example, if trace T1 had a 1 value for all the stats S1-SN, trace T1 may be included in the final trace subset 316. If Trace T1 had a 1 value for stats S1 and S2, but not SN, then another trace having a 1 value for SN may be included in the final trace subset 316 in addition to the trace T1. Not every stat may have a bug, so the number of columns of the final trace subset 316 may be less than or equal to N for the N stats. Not every trace is likely to be selected for the final trace subset 316, so the number of rows of the final trace subset 316 may be less than or equal to M for the M traces.

Figure 4:
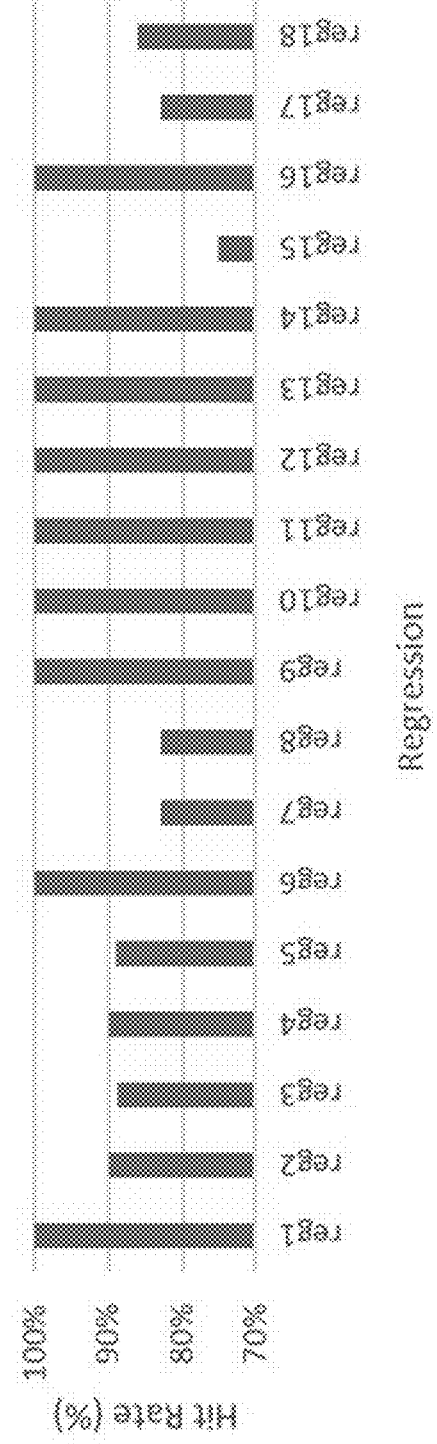
FIG. 4 shows an example graph of hit rates for unique traces for validated regression runs, according to some example embodiments of the present disclosure.

FIG. 4 shows an example graph 400 of hit rates for unique traces for validated regression runs, according to some example embodiments of the present disclosure.

Referring to FIG. 4, to validate the accuracy of the process 300 of FIG. 3, the process 300 was tested on 18 regression runs, and was validated for the following key performance indicators: (1) Number of unique bugs identified out of the total number of traces debugged (e.g., hit rate); and (2) 2. Number of bugs identified which were not identified by a manual validation process. The recommended traces of the final trace subset 316 of FIG. 3 were debugged to find the number of traces that helped in identifying unique bugs in the features out of the total number of traces that were assigned to be debugged. This percentage referred to as the hit rate was observed to be 93%. FIG. 4 shows the hit rates for each regression with the approach of the process 300. In particular, the hit rate with the process 300 was high for all of the regressions runs (e.g., reg1-reg18), and at 100% for half of the regression runs. In this manner, FIG. 4 indicates the strong accuracy of the final traces recommended by the enhanced validation process of FIG. 3 using AI.

FIG. 5 illustrates a flow diagram of an illustrative process 500 for using artificial intelligence to validate performance of integrated circuit features, in accordance with one or more example embodiments of the present disclosure.

At block 502, a device (e.g., the enhanced validation device 619 of FIG. 6) may extract macroinstructions source and destination registers from instruction files (e.g., from the data storage 102 of FIG. 1). Extraction may include use of a parser.

At block 504, the device may generate a dependency graph (e.g., the dependency graph 120 of FIG. 1, the dependency graph 200 of FIG. 2) based on the microinstructions source and destination registers. In the dependency graph, macroinstructions may be nodes and dependencies between the macroinstructions may be edges between the nodes.

At block 506, the device may generate, based on the dependency graph, a frequency distribution of instructions, and stat files (e.g., Perf uarch simulator stat files and RTL stat files), predictors for a machine learning model (e.g., the prediction model 140 of FIG. 1, models 1-N of FIG. 3). The frequency distribution of instructions may be based on extracted instructions opcodes from instruction trace files (e.g., the instruction traces 104). Knobs and values of the stat files may be used as predictors as well for the machine learning model.

At block 508, the device may generate, based on the stat files, ratios of performance univariate autoregressive conditionally heteroscedastic (Perf uarch) simulator model stats to RTL stats, setting the ratios as the target stat ratios for the machine learning model. For example, for a given stat using a Perf uarch simulator model and a RTL model, the result of the stat using the Perf uarch simulator model may diverge from the stat using the RTL model. The larger the ratio of the Perf uarch simulator stat to the RTL stat (or vice versa), the larger the divergence of the stat, indicating a bug in the stat.

At block 510, the device may generate, using the machine learning model and the generated predictors, predicted ratios of Perf uarch simulator stats to RTL stats. Generation of the predictions is shown in FIG. 3, in which the test traces are passed to the various models of the machine learning model for each stat, and sampling occurs at different prediction intervals. The sampling of the predicted stat values for a given trace at a given prediction interval may be represented by matrices.

At block 512, the device may generate, using a greedy constrained optimization on the matrices as shown in FIG. 3, recommended traces for debugging. In particular, the greedy constrained optimization may be applied to each matrix of block 510 to identify the minimum number of traces needed to indicate the bugs indicated by the divergence (e.g., larger ratio of Perf uarch simulator stats to RTL stats) of a stat for given traces. Divergence of a given stat for a given trace sampled at a given interval, when greater than a threshold divergence, indicates a bug in the stat (e.g., indicated by a 1 value in a matrix as shown in FIG. 3). For the stats with a value of 1 after the greedy constrained optimization, the minimum number of traces that may correspond to the stats with a 1 value may be selected for debugging.

It is understood that the above descriptions are for purposes of illustration and are not meant to be limiting.

Figure 6:
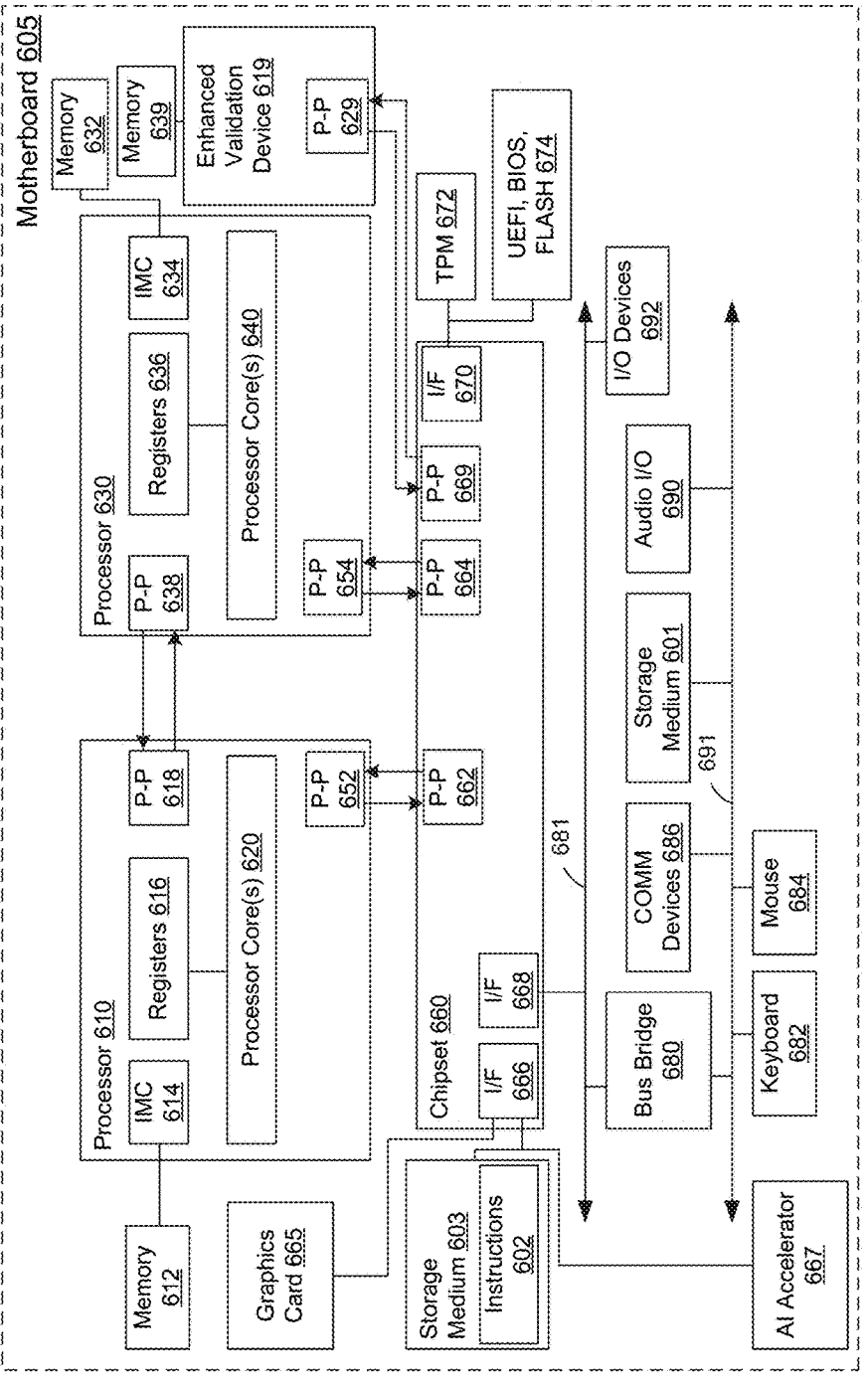
FIG. 6 illustrates an embodiment of an exemplary system, in accordance with one or more example embodiments of the present disclosure.

FIG. 6 illustrates an embodiment of an exemplary system 600, in accordance with one or more example embodiments of the present disclosure.

In various embodiments, the computing system 600 may comprise or be implemented as part of an electronic device.

In some embodiments, the computing system 600 may be representative, for example, of a computer system that implements one or more components and/or performs steps of the processes of FIGS. 1, 3, and 5.

The embodiments are not limited in this context. More generally, the computing system 600 is configured to implement all logic, systems, processes, logic flows, methods, equations, apparatuses, and functionality described herein and with reference to FIGS. 1, 3, and 5.

The system 600 may be a computer system with multiple processor cores such as a distributed computing system, supercomputer, high-performance computing system, computing cluster, mainframe computer, mini-computer, client-server system, personal computer (PC), workstation, server, portable computer, laptop computer, tablet computer, a handheld device such as a personal digital assistant (PDA), or other devices for processing, displaying, or transmitting information. Similar embodiments may comprise, e.g., entertainment devices such as a portable music player or a portable video player, a smart phone or other cellular phones, a telephone, a digital video camera, a digital still camera, an external storage device, or the like. Further embodiments implement larger scale server configurations. In other embodiments, the system 600 may have a single processor with one core or more than one processor. Note that the term "processor" refers to a processor with a single core or a processor package with multiple processor cores.

In at least one embodiment, the computing system 600 is representative of one or more components of FIGS. 1 and 3. More generally, the computing system 600 is configured to implement all logic, systems, processes, logic flows, methods, apparatuses, and functionality described herein with reference to the above figures.

As used in this application, the terms "system" and "component" and "module" are intended to refer to a computer-related entity, either hardware, a combination of hardware and software, software, or software in execution, examples of which are provided by the exemplary system 600. For example, a component can be, but is not limited to being, a process running on a processor, a processor, a hard disk drive, multiple storage drives (of optical and/or magnetic storage medium), an object, an executable, a thread of execution, a program, and/or a computer.

By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

As shown in this figure, system 600 comprises a motherboard 605 for mounting platform components. The motherboard 605 is a point-to-point interconnect platform that includes a processor 610, a processor 630 coupled via a point-to-point interconnects as an Ultra Path Interconnect (UPI), and an enhanced validation device 619 (e.g., capable of performing the functions of FIGS. 1, 3, and 5). In other embodiments, the system 600 may be of another bus architecture, such as a multi-drop bus. Furthermore, each of processors 610 and 630 may be processor packages with multiple processor cores. As an example, processors 610 and 630 are shown to include processor core(s) 620 and 640, respectively. While the system 600 is an example of a two-socket (2S) platform, other embodiments may include more than two sockets or one socket. For example, some embodiments may include a four-socket (4S) platform or an eight-socket (8S) platform. Each socket is a mount for a processor and may have a socket identifier. Note that the term platform refers to the motherboard with certain components mounted such as the processors 610 and the chipset 660. Some platforms may include additional components and some platforms may only include sockets to mount the processors and/or the chipset.

The processors 610 and 630 can be any of various commercially available processors, including without limitation an Intel® Celeron®, Core®, Core (2) Duo®, Itanium®, Pentium®, Xeon®, and XScale® processors; AMID® Athlon®, Duron® and Opteron® processors; ARM® application, embedded and secure processors; IBM® and Motorola® DragonBall® and PowerPC® processors; IBM and Sony® Cell processors; and similar processors. Dual microprocessors, multi-core processors, and other multi-processor architectures may also be employed as the processors 610, and 630.

The processor 610 includes an integrated memory controller (IMC) 614 and point-to-point (P-P) interfaces 618 and 652. Similarly, the processor 630 includes an IMC 634 and P-P interfaces 638 and 654. The IMC's 614 and 634 couple the processors 610 and 630, respectively, to respective memories, a memory 612 and a memory 632. The memories 612 and 632 may be portions of the main memory (e.g., a dynamic random-access memory (DRAM)) for the platform such as double data rate type 3 (DDR3) or type 4 (DDR4) synchronous DRAM (SDRAM). In the present embodiment, the memories 612 and 632 locally attach to the respective processors 610 and 630.

In addition to the processors 610 and 630, the system 600 may include the enhanced validation device 619. The enhanced validation device 619 may be connected to chipset 660 by means of P-P interfaces 629 and 669. The enhanced validation device 619 may also be connected to a memory 639. In some embodiments, the enhanced validation device 619 may be connected to at least one of the processors 610 and 630. In other embodiments, the memories 612, 632, and 639 may couple with the processor 610 and 630, and the enhanced validation device 619 via a bus and shared memory hub.

System 600 includes chipset 660 coupled to processors 610 and 630. Furthermore, chipset 660 can be coupled to storage medium 603, for example, via an interface (I/F) 666. The I/F 666 may be, for example, a Peripheral Component Interconnect-enhanced (PCI-e). The processors 610, 630, and the enhanced validation device 619 may access the storage medium 603 through chipset 660.

Storage medium 603 may comprise any non-transitory computer-readable storage medium or machine-readable storage medium, such as an optical, magnetic or semiconductor storage medium. In various embodiments, storage medium 603 may comprise an article of manufacture. In some embodiments, storage medium 603 may store computer-executable instructions, such as computer-executable instructions 602 to implement one or more of processes or operations described herein, (e.g., process 500 of FIG. 5). The storage medium 603 may store computer-executable instructions for any equations depicted above. The storage medium 603 may further store computer-executable instructions for models and/or networks described herein, such as a neural network or the like. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable types of code, such as source code, compiled code, interpreted code, executable code, static code, dynamic code, object-oriented code, visual code, and the like. It should be understood that the embodiments are not limited in this context.

The processor 610 couples to a chipset 660 via P-P interfaces 652 and 662 and the processor 630 couples to a chipset 660 via P-P interfaces 654 and 664. Direct Media Interfaces (DMIs) may couple the P-P interfaces 652 and 662 and the P-P interfaces 654 and 664, respectively. The DMI may be a high-speed interconnect that facilitates, e.g., eight Giga Transfers per second (GT/s) such as DMI 3.0. In other embodiments, the processors 610 and 630 may interconnect via a bus.

The chipset 660 may comprise a controller hub such as a platform controller hub (PCH). The chipset 660 may include a system clock to perform clocking functions and include interfaces for an I/O bus such as a universal serial bus (USB), peripheral component interconnects (PCIs), serial peripheral interconnects (SPIs), integrated interconnects (I2Cs), and the like, to facilitate connection of peripheral devices on the platform. In other embodiments, the chipset 660 may comprise more than one controller hub such as a chipset with a memory controller hub, a graphics controller hub, and an input/output (I/O) controller hub.

In the present embodiment, the chipset 660 couples with a trusted platform module (TPM) 672 and the UEFI, BIOS, Flash component 674 via an interface (I/F) 670. The TPM 672 is a dedicated microcontroller designed to secure hardware by integrating cryptographic keys into devices. The UEFI, BIOS, Flash component 674 may provide pre-boot code.

Furthermore, chipset 660 includes the I/F 666 to couple chipset 660 with a high-performance graphics engine, graphics card 665. In other embodiments, the system 600 may include a flexible display interface (FDI) between the processors 610 and 630 and the chipset 660. The FDI interconnects a graphics processor core in a processor with the chipset 660.

Various I/O devices 692 couple to the bus 681, along with a bus bridge 680 which couples the bus 681 to a second bus 691 and an I/F 668 that connects the bus 681 with the chipset 660. In one embodiment, the second bus 691 may be a low pin count (LPC) bus. Various devices may couple to the second bus 691 including, for example, a keyboard 682, a mouse 684, communication devices 686, a storage medium 601, and an audio I/O 690 (e.g., including one or more microphones).

The artificial intelligence (AI) accelerator 667 may be circuitry arranged to perform computations related to AI. The AI accelerator 667 may be connected to storage medium 603 and chipset 660. The AI accelerator 667 may deliver the processing power and energy efficiency needed to enable abundant-data computing. The AI accelerator 667 is a class of specialized hardware accelerators or computer systems designed to accelerate artificial intelligence and machine learning applications, including artificial neural networks and machine vision. The AI accelerator 667 may be applicable to algorithms for robotics, internet of things, other data-intensive and/or sensor-driven tasks.

Many of the I/O devices 692, communication devices 686, and the storage medium 601 may reside on the motherboard 605 while the keyboard 682 and the mouse 684 may be add-on peripherals. In other embodiments, some or all the I/O devices 692, communication devices 686, and the storage medium 601 are add-on peripherals and do not reside on the motherboard 605.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, yet still co-operate or interact with each other.

In addition, in the foregoing Detailed Description, various features are grouped together in a single example to streamline the disclosure. This method of disclosure is not to be interpreted as reflecting an intention that the claimed examples require more features than are expressly recited in each claim. Rather, as the following claims reflect, the inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code to reduce the number of times code must be retrieved from bulk storage during execution. The term "code" covers a broad range of software components and constructs, including applications, drivers, processes, routines, methods, modules, firmware, microcode, and subprograms. Thus, the term "code" may be used to refer to any collection of instructions that, when executed by a processing system, perform a desired operation or operations.

Logic circuitry, devices, and interfaces herein described may perform functions implemented in hardware and implemented with code executed on one or more processors. Logic circuitry refers to the hardware or the hardware and code that implements one or more logical functions. Circuitry is hardware and may refer to one or more circuits. Each circuit may perform a particular function. A circuit of the circuitry may comprise discrete electrical components interconnected with one or more conductors, an integrated circuit, a chip package, a chipset, memory, or the like. Integrated circuits include circuits created on a substrate such as a silicon wafer and may comprise components. Integrated circuits, processor packages, chip packages, and chipsets may comprise one or more processors.

Processors may receive signals such as instructions and/or data at the input(s) and process the signals to generate at least one output. While executing code, the code changes the physical states and characteristics of transistors that make up a processor pipeline. The physical states of the transistors translate into logical bits of ones and zeros stored in registers within the processor. The processor can transfer the physical states of the transistors into registers and transfer the physical states of the transistors to another storage medium.

A processor may comprise circuits to perform one or more sub-functions implemented to perform the overall function of the processor. One example of a processor is a state machine or an application-specific integrated circuit (ASIC) that includes at least one input and at least one output. A state machine may manipulate the at least one input to generate the at least one output by performing a predetermined series of serial and/or parallel manipulations or transformations on the at least one input.

The logic as described above may be part of the design for an integrated circuit chip. The chip design is created in a graphical computer programming language, and stored in a computer storage medium or data storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a processor board, a server platform, or a motherboard, or (b) an end product.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (IR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G, 2.5G, 3G, 3.5G, 4G, fifth generation (5G) mobile networks, 3GPP, long term evolution (LTE), LTE advanced, enhanced data rates for GSM Evolution (EDGE), or the like. Other embodiments may be used in various other devices, systems, and/or networks.

The following examples pertain to further embodiments.

Example 1 may include an apparatus for using artificial intelligence to validate performance of integrated circuit features, the apparatus comprising processing circuitry coupled to memory, the processing circuitry configured to: extract, from instruction files, microinstructions source and destination registers; generate a dependency graph based on the microinstructions source and destination registers, the dependency graph comprising macroinstructions as nodes and dependencies between the macroinstructions as edges between the nodes; generate, based on the dependency graph, a frequency distribution of instructions from trace files, performance univariate autoregressive conditionally heteroscedastic (Perf uarch)stat files, and register transfer language (RTL) stat files, predictors for a machine learning model, the predictors comprising instruction frequencies, instruction dependencies, and knob values associated with enabling the integrated circuit features; generate, based on the Perf uarch stat files and the RTL stat files, ratios of Perf uarch stats to RTL stats as target stat ratios; generate, using the predictors and the machine learning model, predicted ratios of Perf uarch stats to RTL stats; and generate, using greedy constrained optimization, based on the target stat ratios and the predicted ratios, recommended traces for debugging, wherein the recommended traces are a subset of traces in the trace files.

Example 2 may include the apparatus of example 1, wherein the subset of the traces is a minimum number of traces from among the traces in the trace files to indicate all divergence between the target stat ratios and the predicted ratios.

Example 3 may include the apparatus of example 2, wherein the divergence is based on a difference between a respective target stat ratio and a respective predicted ratio being greater than a threshold divergence.

Example 4 may include the apparatus of example 1, wherein the processing circuitry is further configured to: sample the traces in the trace files a multiple time intervals; and generate, based on the sampling, matrices using respective traces of the traces in the trace files as rows and stats from the Perf uarch stat files and the RTL stat files as columns, wherein a respective entry of a matrix is a predicted ratio of a Perf uarch stat to a RTL stat for a respective trace, wherein to generate the recommended traces for debugging is further based on the matrices.

Example 5 may include the apparatus of example 4, wherein the greedy constrained optimization comprises generating, based on the matrices, second matrices with respective matrix entries of 0 or 1 based on a difference between a respective target stat ratio and a respective predicted ratio being greater than a threshold divergence.

Example 6 may include the apparatus of example 1, wherein the processing circuitry is further configured to: apply a page rank algorithm to the dependency graph, wherein the predictors are based on the page rank algorithm.

Example 7 may include the apparatus of claim 1, wherein to generate the ratios of Perf uarch stats to RTL stats as target stat ratios is based on a sum of stats updated due to a computation or execution of instructions, stats updated due to known bugs in RTL code, and stats updated due to unknown bugs.

Example 8 may include a non-transitory computer-readable storage medium comprising instructions to cause processing circuitry of a device for using artificial intelligence to validate performance of integrated circuit features, upon execution of the instructions by the processing circuitry, to: extract, from instruction files, microinstructions source and destination registers; generate a dependency graph based on the microinstructions source and destination registers, the dependency graph comprising macroinstructions as nodes and dependencies between the macroinstructions as edges between the nodes; generate, based on the dependency graph, a frequency distribution of instructions from trace files, performance univariate autoregressive conditionally heteroscedastic (Perf uarch)stat files, and register transfer language (RTL) stat files, predictors for a machine learning model, the predictors comprising instruction frequencies, instruction dependencies, and knob values associated with enabling the integrated circuit features; generate, based on the Perf uarch stat files and the RTL stat files, ratios of Perf uarch stats to RTL stats as target stat ratios; generate, using the predictors and the machine learning model, predicted ratios of Perf uarch stats to RTL stats; and generate, using greedy constrained optimization, based on the target stat ratios and the predicted ratios, recommended traces for debugging, wherein the recommended traces are a subset of traces in the trace files.

Example 9 may include the non-transitory computer-readable storage medium of example 8, wherein the subset of the traces is a minimum number of traces from among the traces in the trace files to indicate all divergence between the target stat ratios and the predicted ratios.

Example 10 may include the non-transitory computer-readable storage medium of example 9, wherein the divergence is based on a difference between a respective target stat ratio and a respective predicted ratio being greater than a threshold divergence.

Example 11 may include the non-transitory computer-readable storage medium of example 8, wherein execution of the instructions further causes the processing circuitry to: sample the traces in the trace files a multiple time intervals; and generate, based on the sampling, matrices using respective traces of the traces in the trace files as rows and stats from the Perf uarch stat files and the RTL stat files as columns, wherein a respective entry of a matrix is a predicted ratio of a Perf uarch stat to a RTL stat for a respective trace, wherein to generate the recommended traces for debugging is further based on the matrices.

Example 12 may include the non-transitory computer-readable storage medium of example 11, wherein the greedy constrained optimization comprises generating, based on the matrices, second matrices with respective matrix entries of 0 or 1 based on a difference between a respective target stat ratio and a respective predicted ratio being greater than a threshold divergence.

Example 13 may include the non-transitory computer-readable storage medium of example 8, wherein execution of the instructions further causes the processing circuitry to: apply a page rank algorithm to the dependency graph, wherein the predictors are based on the page rank algorithm.

Example 14 may include the non-transitory computer-readable storage medium of example 8, wherein to generate the ratios of Perf uarch stats to RTL stats as target stat ratios is based on a sum of stats updated due to a computation or execution of instructions, stats updated due to known bugs in RTL code, and stats updated due to unknown bugs.

Example 15 may include a method for using artificial intelligence to validate performance of integrated circuit features, the method comprising: extracting, by processing circuitry of a device, from instruction files, microinstructions source and destination registers; generating, by the processing circuitry, a dependency graph based on the microinstructions source and destination registers, the dependency graph comprising macroinstructions as nodes and dependencies between the macroinstructions as edges between the nodes; generating, by the processing circuitry, based on the dependency graph, a frequency distribution of instructions from trace files, performance univariate autoregressive conditionally heteroscedastic (Perf uarch) stat files, and register transfer language (RTL) stat files, predictors for a machine learning model, the predictors comprising instruction frequencies, instruction dependencies, and knob values associated with enabling the integrated circuit features; generating, by the processing circuitry, based on the Perf uarch stat files and the RTL stat files, ratios of Perf uarch stats to RTL stats as target stat ratios; generating, by the processing circuitry, using the predictors and the machine learning model, predicted ratios of Perf uarch stats to RTL stats; and generating, by the processing circuitry, using greedy constrained optimization, based on the target stat ratios and the predicted ratios, recommended traces for debugging, wherein the recommended traces are a subset of traces in the trace files.

Example 16 may include the example of example 15, wherein the subset of the traces is a minimum number of traces from among the traces in the trace files to indicate all divergence between the target stat ratios and the predicted ratios.

Example 17 may include the example of example 16, wherein the divergence is based on a difference between a respective target stat ratio and a respective predicted ratio being greater than a threshold divergence.

Example 18 may include the method of example 15, further comprising: sampling the traces in the trace files a multiple time intervals; and generating, based on the sampling, matrices using respective traces of the traces in the trace files as rows and stats from the Perf uarch stat files and the RTL stat files as columns, wherein a respective entry of a matrix is a predicted ratio of a Perf uarch stat to a RTL stat for a respective trace, wherein generating the recommended traces for debugging is further based on the matrices.

Example 19 may include the method of example 18, wherein the greedy constrained optimization comprises generating, based on the matrices, second matrices with respective matrix entries of 0 or 1 based on a difference between a respective target stat ratio and a respective predicted ratio being greater than a threshold divergence.

Example 20 may include the method of example 15, further comprising: applying a page rank algorithm to the dependency graph, wherein the predictors are based on the page rank algorithm.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. An apparatus for using artificial intelligence to validate performance of integrated circuit features, the apparatus comprising processing circuitry coupled to memory, the processing circuitry configured to:

extract, from instruction files, microinstructions source and destination registers;

generate a dependency graph based on the microinstructions source and destination registers, the dependency graph comprising macroinstructions as nodes and dependencies between the macroinstructions as edges between the nodes;

generate, based on the dependency graph, a frequency distribution of instructions from trace files, performance univariate autoregressive conditionally heteroscedastic (Perf uarch) stat files, and register transfer language (RTL) stat files, predictors for a machine learning model, the predictors comprising instruction frequencies, instruction dependencies, and knob values associated with enabling the integrated circuit features;

generate, based on the Perf uarch stat files and the RTL stat files, ratios of Perf uarch stats to RTL stats as target stat ratios;

generate, using the predictors and the machine learning model, predicted ratios of Perf uarch stats to RTL stats; and generate, using greedy constrained optimization, based on the target stat ratios and the predicted ratios, recommended traces for debugging, wherein the recommended traces are a subset of traces in the trace files.

2. The apparatus of claim 1, wherein the subset of the traces is a minimum number of traces from among the traces in the trace files to indicate all divergence between the target stat ratios and the predicted ratios.

3. The apparatus of claim 2, wherein the divergence is based on a difference between a respective target stat ratio and a respective predicted ratio being greater than a threshold divergence.

4. The apparatus of claim 1, wherein the processing circuitry is further configured to:

sample the traces in the trace files multiple time intervals; and generate, based on the sampling, matrices using respective traces of the traces in the trace files as rows and stats from the Perf uarch stat files and the RTL stat files as columns, wherein a respective entry of a matrix is a predicted ratio of a Perf uarch stat to a RTL stat for a respective trace, wherein to generate the recommended traces for debugging is further based on the matrices.

5. The apparatus of claim 4, wherein the greedy constrained optimization comprises generating, based on the matrices, second matrices with respective matrix entries of 0 or 1 based on a difference between a respective target stat ratio and a respective predicted ratio being greater than a threshold divergence.

6. The apparatus of claim 1, wherein the processing circuitry is further configured to:

apply a page rank algorithm to the dependency graph, wherein the predictors are based on the page rank algorithm.

7. The apparatus of claim 1, wherein to generate the ratios of Perf uarch stats to RTL stats as target stat ratios is based on a sum of stats updated due to a computation or execution of instructions, stats updated due to known bugs in RTL code, and stats updated due to unknown bugs.

8. A non-transitory computer-readable storage medium comprising instructions to cause processing circuitry of a device for using artificial intelligence to validate performance of integrated circuit features, upon execution of the instructions by the processing circuitry, to:

extract, from instruction files, microinstructions source and destination registers;

generate a dependency graph based on the microinstructions source and destination registers, the dependency graph comprising macroinstructions as nodes and dependencies between the macroinstructions as edges between the nodes;

generate, based on the dependency graph, a frequency distribution of instructions from trace files, performance univariate autoregressive conditionally heteroscedastic (Perf uarch) stat files, and register transfer language (RTL) stat files, predictors for a machine learning model, the predictors comprising instruction frequencies, instruction dependencies, and knob values associated with enabling the integrated circuit features;

generate, based on the Perf uarch stat files and the RTL stat files, ratios of Perf uarch stats to RTL stats as target stat ratios;

generate, using the predictors and the machine learning model, predicted ratios of Perf uarch stats to RTL stats; and generate, using greedy constrained optimization, based on the target stat ratios and the predicted ratios, recommended traces for debugging, wherein the recommended traces are a subset of traces in the trace files.

9. The non-transitory computer-readable storage medium of claim 8, wherein the subset of the traces is a minimum number of traces from among the traces in the trace files to indicate all divergence between the target stat ratios and the predicted ratios.

10. The non-transitory computer-readable storage medium of claim 9, wherein the divergence is based on a difference between a respective target stat ratio and a respective predicted ratio being greater than a threshold divergence.

11. The non-transitory computer-readable storage medium of claim 8, wherein execution of the instructions further causes the processing circuitry to:

sample the traces in the trace files multiple time intervals; and generate, based on the sampling, matrices using respective traces of the traces in the trace files as rows and stats from the Perf uarch stat files and the RTL stat files as columns, wherein a respective entry of a matrix is a predicted ratio of a Perf uarch stat to a RTL stat for a respective trace, wherein to generate the recommended traces for debugging is further based on the matrices.

12. The non-transitory computer-readable storage medium of claim 11, wherein the greedy constrained optimization comprises generating, based on the matrices, second matrices with respective matrix entries of 0 or 1 based on a difference between a respective target stat ratio and a respective predicted ratio being greater than a threshold divergence.

13. The non-transitory computer-readable storage medium of claim 8, wherein execution of the instructions further causes the processing circuitry to:

apply a page rank algorithm to the dependency graph, wherein the predictors are based on the page rank algorithm.

14. The non-transitory computer-readable storage medium of claim 8, wherein to generate the ratios of Perf uarch stats to RTL stats as target stat ratios is based on a sum of stats updated due to a computation or execution of instructions, stats updated due to known bugs in RTL code, and stats updated due to unknown bugs.

15. A method for using artificial intelligence to validate performance of integrated circuit features, the method comprising:

extracting, by processing circuitry of a device, from instruction files, microinstructions source and destination registers;

generating, by the processing circuitry, a dependency graph based on the microinstructions source and destination registers, the dependency graph comprising macroinstructions as nodes and dependencies between the macroinstructions as edges between the nodes;

generating, by the processing circuitry, based on the dependency graph, a frequency distribution of instructions from trace files, performance univariate autoregressive conditionally heteroscedastic (Perf uarch) stat files, and register transfer language (RTL) stat files, predictors for a machine learning model, the predictors comprising instruction frequencies, instruction dependencies, and knob values associated with enabling the integrated circuit features;

generating, by the processing circuitry, based on the Perf uarch stat files and the RTL stat files, ratios of Perf uarch stats to RTL stats as target stat ratios;

generating, by the processing circuitry, using the predictors and the machine learning model, predicted ratios of Perf uarch stats to RTL stats; and generating, by the processing circuitry, using greedy constrained optimization, based on the target stat ratios and the predicted ratios, recommended traces for debugging, wherein the recommended traces are a subset of traces in the trace files.

16. The method of claim 15, wherein the subset of the traces is a minimum number of traces from among the traces in the trace files to indicate all divergence between the target stat ratios and the predicted ratios.

17. The method of claim 16, wherein the divergence is based on a difference between a respective target stat ratio and a respective predicted ratio being greater than a threshold divergence.

18. The method of claim 15, further comprising:

sampling the traces in the trace files multiple time intervals; and generating, based on the sampling, matrices using respective traces of the traces in the trace files as rows and stats from the Perf uarch stat files and the RTL stat files as columns, wherein a respective entry of a matrix is a predicted ratio of a Perf uarch stat to a RTL stat for a respective trace, wherein generating the recommended traces for debugging is further based on the matrices.

19. The method of claim 18, wherein the greedy constrained optimization comprises generating, based on the matrices, second matrices with respective matrix entries of 0 or 1 based on a difference between a respective target stat ratio and a respective predicted ratio being greater than a threshold divergence.

20. The method of claim 15, further comprising:

applying a page rank algorithm to the dependency graph, wherein the predictors are based on the page rank algorithm.

* * * * *